US012676632B2

(12) United States Patent
Zhu

(10) Patent No.: US 12,676,632 B2
(45) Date of Patent: Jul. 7, 2026

(54) METHOD AND APPARATUS FOR CONVERTING TIME SERVICE SIGNAL, AND COMPUTER-READABLE MEDIUM

(71) Applicant: ZTE CORPORATION, Shenzhen (CN)

(72) Inventor: Xiaosan Zhu, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 283 days.

(21) Appl. No.: 18/707,926

(22) PCT Filed: Nov. 16, 2022

(86) PCT No.: PCT/CN2022/132202
§ 371 (c)(1),
(2) Date: May 7, 2024

(87) PCT Pub. No.: WO2023/093585
PCT Pub. Date: Jun. 1, 2023

(65) Prior Publication Data
US 2026/0163587 A1      Jun. 11, 2026

(30) Foreign Application Priority Data

Nov. 24, 2021    (CN) .......................... 202111403539.8

(51) Int. Cl.
*H03M 7/48*          (2006.01)
*H03K 19/20*         (2006.01)
*H03M 5/02*          (2006.01)
(52) U.S. Cl.
CPC .............. *H03M 5/02* (2013.01); *H03K 19/20* (2013.01)
(58) Field of Classification Search
CPC .......... H03M 5/02; H03M 5/08; H03M 1/822; H03M 1/86; H03K 19/20; H03K 19/21
(Continued)

(56) References Cited

U.S. PATENT DOCUMENTS

| | | | |
|---|---|---|---|
| 2015/0093122 A1 | 4/2015 | Wu et al. | |
| 2021/0194489 A1* | 6/2021 | Shi | ........................ H03L 7/0816 |
| 2024/0388272 A1* | 11/2024 | Wu | .......................... H03K 5/24 |

FOREIGN PATENT DOCUMENTS

| | | |
|---|---|---|
| CN | 102255682 A | 11/2011 |
| CN | 105553600 A | 5/2016 |

(Continued)

OTHER PUBLICATIONS

Japan Patent Office, The first Office Action dated Apr. 1, 2025, for corresponding JP application No. 2024-528570.

*Primary Examiner* — Peguy Jean Pierre

(74) *Attorney, Agent, or Firm* — Li & Cai Intellectual Property (USA) Office

(57)          ABSTRACT

Provided are a method for converting a time service signal, an apparatus for converting a time service signal, and a computer-readable medium. The method may include: obtaining, by a conversion unit according to a first time service signal, a second initial time service signal, the first time service signal and the second initial time service signal corresponding to a same time, and outputting the second initial time service signal; and receiving, by a logic OR gate, a trigger signal of the first time service signal and the second initial time service signal, and outputting a second time service signal. The first time service signal has a first format, the second initial time service signal and the second time service signal each have a second format, on time points of the trigger signal, the second initial time service signal, and the second time service signal are all rising edges thereof.

18 Claims, 3 Drawing Sheets

(58) Field of Classification Search
USPC .......................................................... 341/111
See application file for complete search history.

(56) References Cited

FOREIGN PATENT DOCUMENTS

| | | | |
|---|---|---|---|
| CN | 206133200 U | 4/2017 | |
| CN | 111277462 A | 6/2020 | |
| JP | H02226091 A | 9/1990 | |
| JP | 2002084583 A | 3/2002 | |

* cited by examiner

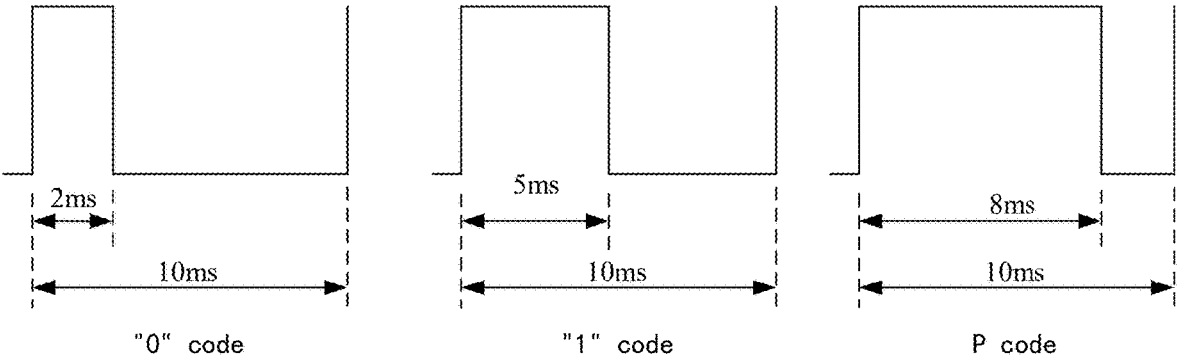

"0" code　　　　　　　"1" code　　　　　　　P code

FIG. 1

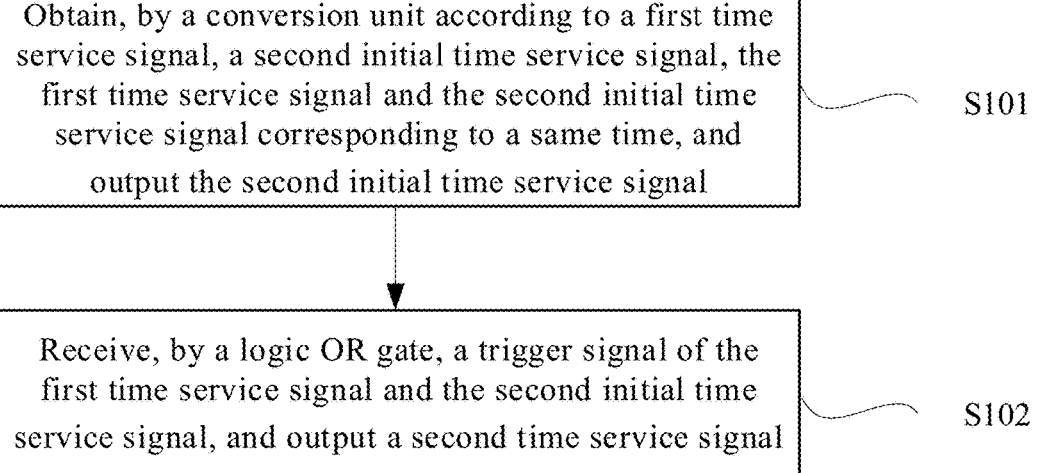

Obtain, by a conversion unit according to a first time service signal, a second initial time service signal, the first time service signal and the second initial time service signal corresponding to a same time, and output the second initial time service signal —— S101

Receive, by a logic OR gate, a trigger signal of the first time service signal and the second initial time service signal, and output a second time service signal —— S102

FIG. 2

Acquire, by the conversion unit, a TOD signal and a 1PPS signal of the first time service signal

S1011

Generate, by the conversion unit according to time obtained by adding a preset time length to the time corresponding to the TOD signal, information of the second initial time service signal, and store the information in a buffer

S1012

Acquire, by the conversion unit in response to one rising edge of the 1PPS signal of the first time service signal, the information of the second initial time service signal generated according to the first time service signal before the preset time length from the buffer, to generate and output the second initial time service signal

S1013

Receive, by a logic OR gate, a trigger signal of the first time service signal and the second initial time service signal, and output a second time service signal

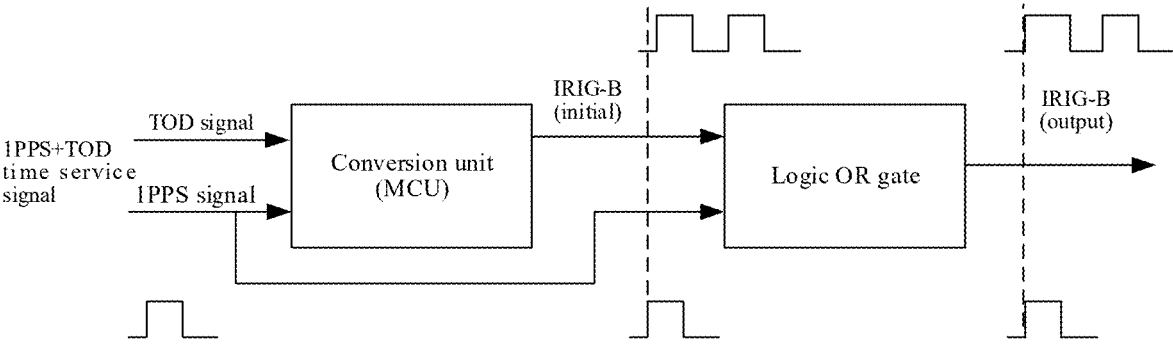

FIG. 4

METHOD AND APPARATUS FOR CONVERTING TIME SERVICE SIGNAL, AND COMPUTER-READABLE MEDIUM

CROSS-REFERENCE TO RELATED APPLICATIONS

This application is a National Phase Application filed under 35 U.S.C. 371 as a national stage of PCT/CN2022/132202, filed on Nov. 16, 2022, an application claiming the priority to the patent application No. 202111403539.8 filed with the CNIPA on Nov. 24, 2021, the entire contents of which are incorporated hereby by reference.

TECHNICAL FIELD

The present disclosure relates to, but is not limited to, the technical field of time service.

BACKGROUND

In many cases, the format of a time service signal has to be converted. For example, the time service output of a modem chip in a customer premise equipment (CPE) of the 5th generation mobile communication technology (5G) is typically in a 1 pulse per second plus time of day (1PPS+TOD) format, while the time service signal applied to and used at the power terminal is generally in an inter-range instrumentation group-B (IRIG-B) format. Therefore, the 1PPS+TOD time service signal has to be converted into an IRIG-B time service signal to be used in the time service for the power terminal.

SUMMARY

The present disclosure provides a method and an apparatus for converting a time service signal, and a computer-readable medium.

In a first aspect, the present disclosure provides a method for converting a time service signal. The method may include: obtaining, by a conversion unit according to a first time service signal, a second initial time service signal, the first time service signal and the second initial time service signal corresponding to a same time, and outputting the second initial time service signal; and receiving, by a logic OR gate, a trigger signal of the first time service signal and the second initial time service signal, and outputting a second time service signal; wherein the first time service signal has a first format, the second initial time service signal and the second time service signal each have a second format, and on time points of the trigger signal of the first time service signal, the second initial time service signal, and the second time service signal are all rising edges thereof.

In a second aspect, the present disclosure provides an apparatus for converting a time service signal. The apparatus may include: a conversion unit configured to obtain, according to a first time service signal, a second initial time service signal, the first time service signal and the second initial time service signal corresponding to a same time, and output the second initial time service signal; and a logic OR gate configured to receive a trigger signal of the first time service signal and the second initial time service signal, and output a second time service signal; wherein the first time service signal has a first format, the second initial time service signal and the second time service signal each have a second format, and on time points of the trigger signal of the first time service signal, the second initial time service signal, and the second time service signal are all rising edges thereof.

In a third aspect, the present disclosure provides a computer-readable medium storing a computer program thereon which, when executed by a processor, causes the processor to implement any method for converting a time service signal as described in the present disclosure.

BRIEF DESCRIPTION OF DRAWINGS

FIG. 1 is a schematic diagram showing formats of different code elements in an IRIG-B time service signal;

FIG. 2 is a flowchart of a method for converting a time service signal according to the present disclosure;

FIG. 3 is a flowchart of another method for converting a time service signal according to the present disclosure;

FIG. 4 is a schematic diagram showing a process of signal processing in a method for converting a time service signal according to the present disclosure;

DETAIL DESCRIPTION OF EMBODIMENTS

Figures 5, 6, 7:
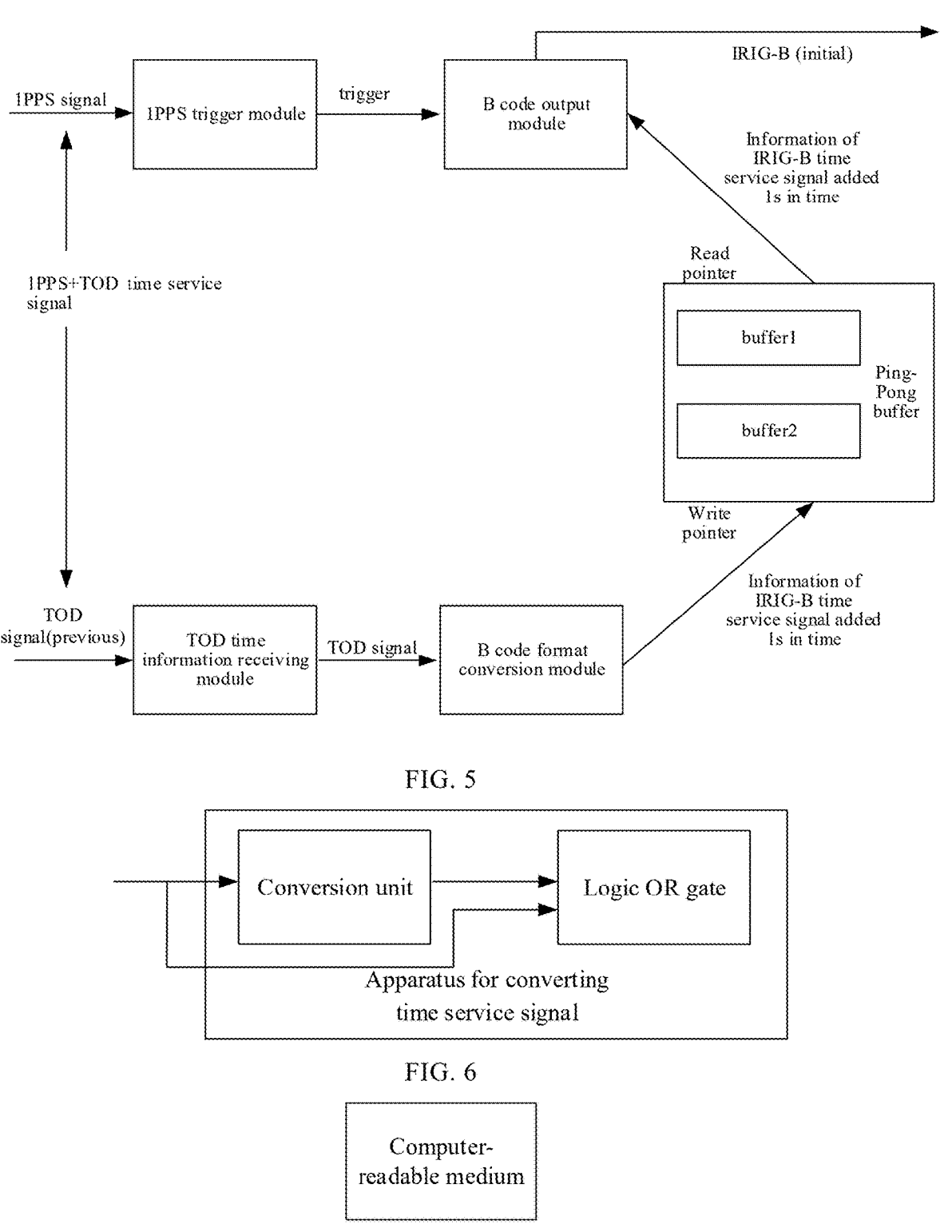
FIG. 5 is a schematic diagram showing a process of obtaining a second initial signal in another method for converting a time service signal according to the present disclosure.
FIG. 6 is a block diagram of an apparatus for converting a time service signal according to the present disclosure.
FIG. 7 is a block diagram of a computer-readable medium according to the present disclosure.

To improve understanding of the technical solution of the present disclosure for those skilled in the art, the method and the apparatus for converting a time service signal, and the computer-readable medium according to the implementations of the present disclosure will be described in detail below in conjunction with the accompanying drawings.

The present disclosure will be described more sufficiently below with reference to the accompanying drawings, where the illustrated implementations may be embodied in different forms. However, the present disclosure should not be construed as being limited to the implementations set forth herein. Rather, these implementations are provided so that the present disclosure will be thorough and complete, and will fully convey the scope of the present disclosure to those skilled in the art.

The accompanying drawings are provided for further understanding of the implementations of the present disclosure and constitute a part of the specification. Hereinafter, these drawings are intended to explain the present disclosure together with the detailed implementations, but should not be considered as a limitation to the present disclosure. The above and other features and advantages will become more apparent to those skilled in the art by describing the detailed implementations with reference to the accompanying drawings.

The present disclosure may be described with reference to plan and/or sectional views in idealized representations of the present disclosure. Accordingly, the example illustrations may be modified in accordance with the manufacturing technique and/or the tolerance.

Implementations of the present disclosure and features thereof may be combined with each other without conflict.

The terminology used in the present disclosure is for the purpose of describing particular implementations only and is not intended to be limiting of the present disclosure. As used herein, the term "and/or" includes any and all combinations of one or more of the associated listed items. As used herein, the singular forms "a", "an" and "the" are intended to include the plural forms as well, unless the context clearly indicates otherwise. As used herein, the terms "include" and "consist of . . . " specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used in the present disclosure have the same meaning as commonly understood by one of ordinary skill in the art. It will be further understood that terms, such as those defined in commonly used dictionaries, should be interpreted as having a meaning that is consistent with their meaning in the context of the existing art and the present disclosure, and will not be interpreted in an idealized or overly formal sense unless expressly so defined in the present disclosure.

The present disclosure is not limited to the implementations shown in the drawings, but includes modifications of configurations formed based on a manufacturing process. Therefore, the regions illustrated in the figures have schematic properties, and the shapes of the regions shown in the figures illustrate specific shapes of regions of elements, but are not intended to be limitative.

In some existing art, the format conversion of the time service signal is desired. For example, in the process of time service for a power terminal, an 1PPS+TOD time service signal may be desired to be converted into an IRIG-B time service signal.

The 1PPS+TOD, i.e., 1 pulse per second plus time of day, is in a format of "1 pulse per second plus time of day", which includes a trigger signal as a basis for on time, and a time of day (TOD) signal characterizing the specific time. The trigger signal is sent based on a cycle of 1 second (1PPS), and a rising edge (starting edge) of the trigger signal is an on time point. The TOD signal is sent 1 ms after the on time point of the trigger signal, and used for characterizing the specific time.

The "on time point" is also referred to as "on time edge", and an instant at which the on time point arrives in the time service signal (e.g., a trigger signal of the time service signal) is defined as the time indicated by the time service signal. For example, if a time service signal corresponds to the time 15:00:00, and the on time point thereof is a rising edge of the trigger signal of the time service signal, a device receiving the time service signal may assume that the instant at which the rising edge of the trigger signal arrives is the time 15:00:00.

The inter-range instrumentation group-B (IRIG-B) time service signal is in the format of "inter-range instrumentation group-B", "B code" for short, which is timed once per second with each time service signal (one frame signal) including 100 pulses (100 PPS) and a rising edge of the first pulse as an on time point. Pulses of different bits are used for representing information of seconds, ten seconds, minutes, ten minutes, hours, ten hours, days, ten days, hundred days, and the like of the time, and used as identification marks (P codes), etc. Each code element has a total duration of 10 ms, the meaning of which is determined by the pulse width (i.e., a duty cycle of the code element). For example, as shown in FIG. 1, a pulse width 2 ms represents a code "0", a pulse width 5 ms represents a code "1", and a pulse width 8 ms represents an identification mark (P code).

However, the signal conversion will inevitably consume some time, resulting in a delay in the converted time service signal over the original time service signal, that is, inaccurate time and low precision, which cannot satisfy the practical application requirements of many scenarios (such as a power differential protection scenario).

In a first aspect, the present disclosure provides a method for converting a time service signal.

The method for converting a time service signal of the present disclosure is used to convert an input time service signal in one format into a time service signal in another format for outputting. Therefore, the method can be applied in the case that a format of the available original time service signal does not match a format of the time service signal required by a target device (such as a power terminal).

The method for converting a time service signal of the present disclosure may be executed by an apparatus for converting a time service signal, which may be a separate device dedicated for conversion, or may be integrated with a device for generating the original time service signal (such as a 5G CPE power product supporting a 5G time service function, a device supporting GPS time service, or the like), or may be integrated with a target device (such as a power terminal) needing the converted time service signal.

Referring to FIGS. 2, 4 and 6, in some implementations, the method of the present disclosure may include the following operations S101 and S102.

At operation S101, obtaining, by a conversion unit according to a first time service signal, a second initial time service signal, the first time service signal and the second initial time service signal corresponding to a same time, and outputting the second initial time service signal.

At operation S102, receiving, by a logic OR gate, a trigger signal of the first time service signal and the second initial time service signal, and outputting a second time service signal.

The first time service signal has a first format, the second initial time service signal and the second time service signal each have a second format, and on time points of the trigger signal of the first time service signal, the second initial time service signal, and the second time service signal are all rising edges thereof.

A conversion unit of an apparatus for converting a time service signal receives a time service signal in one format (a first format), and converts the time service signal into a time service signal (a second initial time service signal) in another different format (a second format) that represents the same time. Then, the second initial time service signal and a trigger signal of the original first time service signal are input to a logic OR gate, and an output of the logic OR gate is taken as the finally converted second time service signal.

Referring to FIG. 4, since the conversion consumes certain time, the converted second initial time service signal (the IRIG-B (initial) in FIG. 4) is inevitably delayed relative to the first time service signal (the 1PPS+TOD time service signal in FIG. 4). In other words, the on time point (on time, rising edge) of the second initial time service signal is slightly later than the on time point (rising edge) of the trigger signal of the first time service signal. With the "OR" operation, the on time point (rising edge) of the finally output second time service signal (the IRIG-B (output) in FIG. 4) can be synchronized with the on time point of the trigger signal of the first time service signal. In other words, "it is ensured that the on time point of the finally converted second time service signal is aligned with the on time point of the original first time service signal", while the second time service signal represents the same time as the first time service signal. Therefore, the second time service signal can implement the time service accurately with a high precision.

Pulses (code elements) in the time service signal all have a width in the order of at least milliseconds (ms), and the conversion takes at most tens of microseconds (μs), which means that the delay caused by the conversion will inevitably be far shorter than a length of the code element in the time service signal. Therefore, although the above "OR" operation changes the pulse width (duty cycle) of the first pulse of the second time service signal, it only affects the on time point without affecting the information actually expressed by the code element.

In the present disclosure, the second initial time service signal in the second format is obtained by converting from the first time service signal in the first format, but instead of directly outputting the second initial time service signal, the second initial time service signal and the trigger signal of the first time service signal are input to the logic OR gate together. In an embodiment, with the "OR" operation, it is ensured that the on time point output from the logic OR gate is the same as the on time point of the trigger signal of the first time service signal. That is, it is equivalent to that the second time service signal obtained by converting from the first time service signal is advanced to be synchronous with the first time service signal, so that the delay in the second time service signal due to the time consumed by the conversion is eliminated, and the first time service signal and the second time service signal are ensured to be aligned in time. In other words, the converted signal is ensured to have a high precision (<1 μs) so that the practical application requirements of various scenarios (such as a power differential protection scenario) are satisfied.

In some implementations, the conversion unit includes a micro controller unit (MCU).

As an implementation of the present disclosure, referring to FIG. 4, the conversion unit may include a micro controller unit (MCU), and for example, the conversion unit may be a "single chip microcomputer".

In some existing art, the conversion of the time service signal may be performed by a field programmable gate array (FPGA). However, the printed circuit board (PCB) of the FPGA has a large size, high cost and high power consumption, and thus is difficult to implement in practical applications.

Compared with the FPGA, the MCU has the advantages of low cost, low power consumption, small size, easy practicality, and the like, but the conversion precision is generally lower.

In the present disclosure, since the alignment of the time service signals is implemented by the logic OR gate, the conversion accuracy of the MCU itself (the accuracy of the second initial time service signal) does not substantially affect the accuracy of the finally output second time service signal, and therefore, if the MCU is used as the conversion unit, the time service signal conversion of low cost, low power consumption, small size, and high precision can be implemented.

Apparently, the specific form of the conversion unit in the present disclosure is not limited to the MCU, and for example, an FPGA may be used as the conversion unit.

In some implementations, the first format is 1PPS+TOD; the second format is IRIG-B; and the trigger signal of the first time service signal is a 1PPS signal.

Exemplarily, as an implementation of the present disclosure, the method may be used to convert a 1PPS+TOD time service signal into an IRIG-B time service signal. Accordingly, the first time service signal in this case is a 1PPS+TOD time service signal, the trigger signal therein is a 1PPS signal, the second initial time service signal is IRIG-B (initial), and the second time service signal is IRIG-B (output).

In the following description, the 1PPS+TOD time service signal and the IRIG-B time service signal are used as examples for illustration.

Apparently, the specific format of the time service signals in the present disclosure is not limited thereto, and the present disclosure can also be used for conversion of time service signals of other formats (including, but not limited to, DCLS time service signals, NTP time service signals, PTP time service signals, etc.), as long as the on time point of the time service signal is a rising edge.

In some implementations, referring to FIGS. 3 and 5, the operation S101 of obtaining, by the conversion unit according to the first time service signal, the second initial time service signal, the first time service signal and the second initial time service signal corresponding to a same time, and outputting the second initial time service signal may include the following operations S1011 to S1013.

At operation S1011, acquiring, by the conversion unit, a time of day (TOD) signal and a 1PPS signal of the first time service signal.

At operation S1012, generating, by the conversion unit according to time obtained by adding a preset time length to the time corresponding to the TOD signal, information of the second initial time service signal, and storing the information in a buffer.

At operation S1013, acquiring, by the conversion unit in response to one rising edge of the 1PPS signal of the first time service signal, the information of the second initial time service signal generated according to the first time service signal before the preset time length from the buffer, to generate and output the second initial time service signal.

Referring to FIG. 5, the conversion unit may receive (e.g., by a TOD time information receiving module) a TOD signal in the 1PPS+TOD time service signal (the first time service signal). Then time of the TOD signal is parsed (e.g., by a B code format conversion module), and added by a preset time length (e.g., 1 s). According to the obtained time (for example, if the time of the TOD signal is 15:00:00, the time added by 1 s is 15:00:01), encoding (e.g., BCD encoding) is performed again to obtain the information (e.g., a type of each code element of the IRIG-B time service signal) of the IRIG-B time service signal (second initial time service signal), which is then stored in a buffer. When a 1PPS signal (trigger signal) in a (e.g., next) 1PPS+TOD time service signal after the preset time length arrives, the read out of information of a current IRIG-B time service signal in the buffer may be triggered (e.g., by a 1PPS trigger module), and a second initial time service signal, i.e., the IRIG-B (initial) in FIGS. 4 and 5, generated according to the information is output (e.g., by a B code output module). The above triggering may actually be understood as output of the information corresponding to a (e.g., previous) TOD signal before the preset time length is triggered by each 1PPS signal.

For the same time service signal, the TOD signal itself is 1ms later than the 1PPS signal, and certain time is involved to obtain the second initial time service signal by conversion of the TOD signal. In other words, the time of actually generating the second initial time service signal (IRIG-B (initial)) is inevitably and severely delayed than the time represented by the directly corresponding TOD signal. Therefore, to avoid an error caused by an excessive distortion of the first code element in the second time service signal obtained through the logic OR gate due to an excessive time difference between the second initial time service signal and the 1PPS signal, the time corresponding to the TOD signal may be converted after being added by a preset time length (e.g., 1 s), and output upon triggering by an 1PPS signal after the preset time length (e.g., the 1PPS signal of 1s described below) (since the 1PPS signal is naturally 1 s, such output is still accurate).

Apparently, to reduce the time difference as much as possible, the preset time length may be 1 second, and accordingly, the signals before/after the preset time length are the previous/next signals.

In some implementations, the information of the second initial time service signal is pulse width modulation (PWM) information of each pulse of the second initial time service signal.

As an implementation of the present disclosure, since the number and position (with an interval of 10 ms) of pulses (code elements) of IRIG-B time service signal are set, and the meanings of corresponding code elements are distinguished purely by the pulse widths (e.g., 8 ms, 5 ms, 2 ms) of the respective pulses, all signals in the IRIG-B time service signal can be represented as long as the pulse width modulation (PWM) information (e.g., the duty cycle, or the pulse width or the like) of each pulse (code element) therein is stored, thereby reducing the amount of information to be stored and simplifying the information format.

For example, for each IRIG-B time service signal, 100 duty cycle values corresponding to 100 pulses thereof may be sequentially stored in a buffer, and an array of the 100 values may be used as the information corresponding to the IRIG-B time service signal.

Therefore, when an IRIG-B time service signal (i.e., the second initial time service signal of the B code) is started to be generated according to the information (e.g., when a next 1PPS signal is received), a 10 ms timer may be started so that a value is read from the buffered array every 10 ms, and a single pulse with a corresponding pulse width is generated and output according to the value.

Apparently, it is also possible that the information of the second initial time service signal is in other forms or is stored in other manners.

In some implementations, the preset time length is 1 second, and the buffer is a ping-pong buffer.

As an implementation of the present disclosure, the buffer for storing the information of the second initial time service signal may be a "ping-pong buffer". Referring to FIG. 5, the ping-pong buffer actually includes two buffer areas, i.e., buffer1 and buffer2. When the information of the second initial time service signal is written into buffer1, the previously stored information of the second initial time service signal can be read from buffer2 to generate the second initial time service signal. When the information of the second initial time service signal is written into buffer2, the previously stored information of the second initial time service signal can be read from buffer1 to generate the second initial time service signal.

For example, referring to FIG. 5, a read pointer and a write pointer may be provided and alternately point to buffer1 and buffer2 to alternately perform read and write operations on buffer1 and buffer2.

With the ping-pong buffer, information can be read and written simultaneously at any time with a very small buffer space without other operations such as information copying, so that the method of the present disclosure can operate well and output the second initial time service signal in a continuous and reliable manner with a simple structure and low cost (such as in an MCU).

Apparently, the specific form of the buffer in the implementations of the present disclosure is not limited thereto, as long as the buffer can timely implement writing and reading of the information of the second initial time service signal.

In a second aspect, the present disclosure provides an apparatus for converting a time service signal.

The apparatus for converting a time service signal of the present disclosure is used for implementing the method for converting a time service signal as described above.

The apparatus for converting a time service signal of the present disclosure may be a separate device dedicated for conversion, or may be integrated with a device for generating the original time service signal (such as a 5G CPE power product supporting a 5G time service function, a device supporting GPS time service, or the like), or may be integrated with a target device (such as a power terminal) needing the converted time service signal.

Referring to FIG. 6, in an implementation, the apparatus for converting a time service signal of the present disclosure includes: a conversion unit configured to obtain, according to a first time service signal, a second initial time service signal, the first time service signal and the second initial time service signal corresponding to a same time, and output the second initial time service signal; and a logic OR gate configured to receive a trigger signal of the first time service signal and the second initial time service signal, and output a second time service signal. The first time service signal has a first format, the second initial time service signal and the second time service signal each have a second format, and on time points of the trigger signal of the first time service signal, the second initial time service signal, and the second time service signal are all rising edges thereof.

In some implementations, the conversion unit includes an MCU.

In some implementations, the first format is 1PPS+TOD; the second format is IRIG-B; and the trigger signal of the first time service signal is a 1PPS signal.

In a third aspect, referring to FIG. 8, the present disclosure provides a computer-readable medium storing a computer program thereon which, when executed by a processor, causes the processor to implement the method for converting a time service signal according to any implementation of the present disclosure.

Those of ordinary skill in the art will appreciate that all or some operations, functional modules/units in the system and apparatus disclosed above may be implemented as software, firmware, hardware, and suitable combinations thereof.

In a hardware implementation, the division between the functional modules/units mentioned in the above description does not necessarily correspond to the division of physical components; for example, one physical component may have multiple functions, or one function or operation may be performed cooperatively by several physical components.

Some or all physical components may be implemented as software executed by a processor, such as a central processing unit (CPU), a digital signal processor or microprocessor, or implemented as hardware, or implemented as an integrated circuit, such as an application specific integrated circuit. Such software may be distributed on a computer-readable medium which may include a computer storage medium (or non-transitory medium) and communication medium (or transitory medium). As is well known to those of ordinary skill in the art, the term computer storage medium includes volatile and nonvolatile, removable and non-removable medium implemented in any method or technology for storing information, such as computer-readable instructions, data structures, program modules or other data. The computer storage medium includes, but is not limited to, a random access memory (RAM, more specifically SDRAM, DDR, etc.), a read-only memory (ROM), an electrically erasable programmable read-only memory (EE-PROM) or a flash memory (FLASH) or any other magnetic disk storage; a compact disk read-only memory (CD-ROM), a digital versatile disk (DVD), or other optical disk storage; a magnetic cassette, a magnetic tape, a magnetic disk memory or any other magnetic storage; or any other medium which can be used to store the desired information and accessed by a computer. Moreover, it is well known to those ordinary skilled in the art that a communication medium typically includes a computer-readable instruction, a data structure, a program module, or other data in a modulated data signal, such as a carrier wave or other transport mechanism, and may include any information delivery medium.

The present disclosure has disclosed example implementations, and although specific terms are employed, they are used and should be interpreted merely in a generic and descriptive sense, not for purposes of limitation. In some instances, as would be apparent to one skilled in the art, features, characteristics and/or elements described in connection with a particular implementation may be used alone or in combination with features, characteristics and/or elements described in connection with another implementation, unless expressly stated otherwise. It will, therefore, be understood by those skilled in the art that various changes in form and details may be made therein without departing from the scope of the present disclosure as set forth in the appended claims.

What is claimed is:

1. A method for converting a time service signal, comprising:

obtaining, by a conversion unit according to a first time service signal, a second initial time service signal, the first time service signal and the second initial time service signal corresponding to a same time, and outputting the second initial time service signal; and receiving, by a logic OR gate, a trigger signal of the first time service signal and the second initial time service signal, and outputting a second time service signal;

wherein the first time service signal has a first format, the second initial time service signal and the second time service signal each have a second format, and on time points of the trigger signal of the first time service signal, the second initial time service signal, and the second time service signal are all rising edges thereof.

2. The method according to claim 1, wherein the conversion unit comprises a micro controller unit (MCU).

3. The method according to claim 1, wherein the first format is 1 pulse per second plus time of day (1PPS+TOD);

the second format is inter-range instrumentation group-B (IRIG-B); and the trigger signal of the first time service signal is a 1 pulse per second (1PPS) signal.

4. The method according to claim 3, wherein the obtaining, by the conversion unit according to the first time service signal, the second initial time service signal, the first time service signal and the second initial time service signal corresponding to the same time, and outputting the second initial time service signal comprises:

acquiring, by the conversion unit, a time of day (TOD) signal and a 1PPS signal of the first time service signal;

generating, by the conversion unit according to time obtained by adding a preset time length to time corresponding to the TOD signal, information of the second initial time service signal, and storing the information in a buffer; and acquiring, by the conversion unit in response to one rising edge of the 1PPS signal of the first time service signal, the information of the second initial time service signal generated according to the first time service signal before the preset time length from the buffer, to generate and output the second initial time service signal.

5. The method according to claim 4, wherein the preset time length is 1 second; and the buffer is a ping-pong buffer.

6. The method according to claim 4, wherein the information of the second initial time service signal is pulse width modulation (PWM) information of each pulse of the second initial time service signal.

7. An apparatus for converting a time service signal, comprising:

a conversion unit configured to obtain, according to a first time service signal, a second initial time service signal, the first time service signal and the second initial time service signal corresponding to a same time, and output the second initial time service signal; and a logic OR gate configured to receive a trigger signal of the first time service signal and the second initial time service signal, and output a second time service signal;

wherein the first time service signal has a first format, the second initial time service signal and the second time service signal each have a second format, and on time points of the trigger signal of the first time service signal, the second initial time service signal, and the second time service signal are all rising edges thereof.

8. The apparatus according to claim 7, wherein the conversion unit comprises a micro controller unit (MCU).

9. The apparatus according to claim 7, wherein the first format is 1 pulse per second plus time of day (1PPS+TOD);

the second format is inter-range instrumentation group-B (IRIG-B); and the trigger signal of the first time service signal is a 1PPS signal.

10. The apparatus according to claim 9, wherein the conversion unit is configured to:

acquire a time of day (TOD) signal and a 1PPS signal of the first time service signal;

generate, according to time obtained by adding a preset time length to time corresponding to the TOD signal, information of the second initial time service signal, and store the information in a buffer; and acquire, in response to one rising edge of the 1PPS signal of the first time service signal, the information of the second initial time service signal generated according to the first time service signal before the preset time length from the buffer, to generate and output the second initial time service signal.

11. The apparatus according to claim 10, wherein the preset time length is 1 second; and the buffer is a ping-pong buffer.

12. The apparatus according to claim 10, wherein the information of the second initial time service signal is pulse width modulation (PWM) information of each pulse of the second initial time service signal.

13. A non-transitory computer-readable medium storing a computer program thereon which, when executed by a processor, causes the processor to implement a method for converting a time service signal comprising:

obtaining, by a conversion unit according to a first time service signal, a second initial time service signal, the first time service signal and the second initial time service signal corresponding to a same time, and outputting the second initial time service signal; and receiving, by a logic OR gate, a trigger signal of the first time service signal and the second initial time service signal, and outputting a second time service signal;

wherein the first time service signal has a first format, the second initial time service signal and the second time service signal each have a second format, and on time points of the trigger signal of the first time service signal, the second initial time service signal, and the second time service signal are all rising edges thereof.

14. The non-transitory computer-readable medium according to claim 13, wherein the conversion unit comprises a micro controller unit (MCU).

15. The non-transitory computer-readable medium according to claim 13, wherein the first format is 1 pulse per second plus time of day (1PPS+TOD);

the second format is inter-range instrumentation group-B (IRIG-B); and the trigger signal of the first time service signal is a 1 pulse per second (1PPS) signal.

16. The non-transitory computer-readable medium according to claim 15, wherein the obtaining, by the con-version unit according to the first time service signal, the second initial time service signal, the first time service signal and the second initial time service signal corresponding to the same time, and outputting the second initial time service signal comprises:

acquiring, by the conversion unit, a time of day (TOD) signal and a 1PPS signal of the first time service signal;

generating, by the conversion unit according to time obtained by adding a preset time length to time corresponding to the TOD signal, information of the second initial time service signal, and storing the information in a buffer; and acquiring, by the conversion unit in response to one rising edge of the 1PPS signal of the first time service signal, the information of the second initial time service signal generated according to the first time service signal before the preset time length from the buffer, to generate and output the second initial time service signal.

17. The non-transitory computer-readable medium according to claim 16, wherein the preset time length is 1 second; and the buffer is a ping-pong buffer.

18. The non-transitory computer-readable medium according to claim 16, wherein the information of the second initial time service signal is pulse width modulation (PWM) information of each pulse of the second initial time service signal.

* * * * *